US010777612B2

(12) United States Patent
Hu et al.

(10) Patent No.: US 10,777,612 B2
(45) Date of Patent: Sep. 15, 2020

(54) PIXEL ARRAY WITH SUB-PIXELS COMPRISING VERTICALLY STACKED LIGHT EMITTING LAYERS

(71) Applicant: Au Optronics Corporation, Hsinchu (TW)

(72) Inventors: Hung-Chieh Hu, Miaoli County (TW); Yi-Hong Chen, Taichung (TW); Chung-Chia Chen, New Taipei (TW); Meng-Ting Lee, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/006,818

(22) Filed: Jun. 12, 2018

(65) Prior Publication Data

US 2018/0366521 A1    Dec. 20, 2018

(30) Foreign Application Priority Data

Jun. 14, 2017    (TW) .............................. 106119756 A

(51) Int. Cl.
*H01L 29/20*    (2006.01)
*H01L 33/00*    (2010.01)
(Continued)

(52) U.S. Cl.
CPC ...... *H01L 27/3211* (2013.01); *H01L 51/5012* (2013.01); *H01L 51/5016* (2013.01);
(Continued)

(58) Field of Classification Search
CPC ............. H01L 27/3211; H01L 51/5012; H01L 51/5016; H01L 51/56; H01L 27/3213;
(Continued)

(56) References Cited

U.S. PATENT DOCUMENTS 8,471,275 B2    6/2013    Lee et al.
8,575,603 B2    11/2013    Chu et al.
(Continued)

FOREIGN PATENT DOCUMENTS

CN    102593150    7/2012
CN    102610630    7/2012
(Continued)

OTHER PUBLICATIONS

"Office Action of Taiwan Counterpart Application," dated Mar. 22, 2018, p. 1-p. 12.

*Primary Examiner* — Ismail A Muse
(74) *Attorney, Agent, or Firm* — JCIPRNET

(57) ABSTRACT

A pixel array including a plurality of pixel units is provided. Each of the pixel unit includes at least a first color subpixel, a second color subpixel and a $N^{th}$ color subpixel, wherein N is an integer and N≥3. The first color subpixel includes a first stacked light-emitting layer, the second color subpixel includes a second stacked light-emitting layer, and the $N^{th}$ color subpixel includes a $N^{th}$ stacked light-emitting layer. The first stacked light-emitting layer, the second stacked light-emitting layer, and the third stacked light-emitting layer each include a main light-emitting layer and an auxiliary light-emitting layer. The main light-emitting layer of the first color subpixel and the auxiliary light-emitting layer of the second color subpixel are the same material layer. The main light-emitting layer of the $N^{th}$ color subpixel and the auxiliary light-emitting layer of the first color subpixel are the same material layer.

12 Claims, 12 Drawing Sheets

(51) Int. Cl.
*H01L 27/32* (2006.01)
*H01L 51/50* (2006.01)
*H01L 51/56* (2006.01)
*H01L 51/00* (2006.01)

(52) U.S. Cl.
CPC .......... *H01L 51/56* (2013.01); *H01L 27/3213* (2013.01); *H01L 51/0011* (2013.01); *H01L 51/5088* (2013.01); *H01L 2251/558* (2013.01)

(58) Field of Classification Search
CPC ........... H01L 51/0011; H01L 2251/558; H01L 51/5088; H01L 27/3218; H01L 51/001
See application file for complete search history.

(56) References Cited

U.S. PATENT DOCUMENTS

| | | |
|---|---|---|
| 8,847,857 B2 | 9/2014 | Liu et al. |
| 8,946,735 B2 | 2/2015 | Lee et al. |
| 9,065,079 B2 | 6/2015 | Liu et al. |
| 2007/0046195 A1 | 3/2007 | Chin et al. |
| 2007/0052354 A1 | 3/2007 | Chang et al. |
| 2011/0180825 A1* | 7/2011 | Lee ..................... H01L 51/5048 257/89 |
| 2013/0140533 A1 | 6/2013 | Lee et al. |
| 2013/0140535 A1 | 6/2013 | Chu et al. |
| 2013/0147689 A1 | 6/2013 | Liu et al. |
| 2014/0131674 A1* | 5/2014 | Park ..................... H01L 27/3209 257/40 |
| 2014/0209870 A1* | 7/2014 | Shim ................... H01L 51/5036 257/40 |
| 2014/0342483 A1 | 11/2014 | Liu et al. |
| 2016/0056214 A1 | 2/2016 | Pyo et al. |
| 2017/0040388 A1 | 2/2017 | Yan et al. |
| 2017/0194602 A1* | 7/2017 | Cui ........................ H01L 51/56 |
| 2017/0250234 A1* | 8/2017 | He ........................ H01L 51/5265 |
| 2019/0053347 A1* | 2/2019 | Lee ...................... H05B 33/0857 |
| 2019/0189702 A1* | 6/2019 | Park .................... H01L 51/5044 |
| 2019/0206849 A1* | 7/2019 | Jang ....................... H01L 25/13 |

FOREIGN PATENT DOCUMENTS

| | | |
|---|---|---|
| CN | 103050630 | 7/2012 |
| CN | 103441136 | 12/2013 |
| CN | 104617130 | 5/2015 |
| CN | 104733506 | 6/2015 |
| EP | 3279945 | 2/2018 |
| TW | I280817 | 5/2007 |
| TW | I281360 | 5/2007 |
| TW | I540938 | 7/2016 |
| TW | 201705467 | 2/2017 |

* cited by examiner

PIXEL ARRAY WITH SUB-PIXELS COMPRISING VERTICALLY STACKED LIGHT EMITTING LAYERS

CROSS-REFERENCE TO RELATED APPLICATION

This application claims the priority benefit of Taiwan application serial no. 106119756, filed on Jun. 14, 2017. The entirety of the above-mentioned patent application is hereby incorporated by reference herein and made a part of this specification.

BACKGROUND OF THE INVENTION

1. Field of the Invention

The present invention generally relates to a pixel array, in particular, to a pixel array that can improve resolution, and a manufacturing method thereof.

2. Description of Related Art

Conventionally, a panel of organic light emitting diode is manufactured by using fine metal mask (FMM) to separate different sub-pixels, and for achieving a red, green and blue arrangement through deposition. However, the size of the fine metal mask (FMM) has certain limits, for instance, the size of an opening of the FMM can only be reduced to about 30 microns in the current process. Due to the restrictions in the mask process, it becomes more difficult to improve the pixel density and resolution in the panels. According to conventional methods, it is generally possible to achieve higher pixel density and resolution through different pixel arrangements. However, the degree of improvement by varying the pixel arrangement to increase pixel density is limited, and each sub-pixel still remains to have the same size. Based on the above, how to produce a pixel array with higher pixel density and resolution under the constraints of existing fine metal mask is an important topic that is currently under active research.

SUMMARY OF THE INVENTION

Accordingly, the present invention is directed to a pixel array and manufacturing method thereof, which can be used to improve the pixel density and resolution of panels.

The present invention provides a pixel array comprising a plurality of pixel units. Each of the pixel units comprises at least a first color sub-pixel, a second color sub-pixel and a $N^{th}$ color sub-pixel, wherein N is an integer and N≥3. The first color sub-pixel comprises a first stacked light-emitting layer, the second color sub-pixel comprise a second stacked light-emitting layer, and the $N^{th}$ color sub-pixel comprises a $N^{th}$ stacked light-emitting layer. The first stacked light-emitting layer, the second stacked light-emitting layer, and the $N^{th}$ stacked light emitting layer each comprise a main light-emitting layer and an auxiliary light-emitting layer. The main light-emitting layer and the auxiliary light-emitting layer are light emitting layers of different color, wherein the auxiliary light-emitting layer is stacked on the main light-emitting layer in the first color sub-pixel, the main light-emitting layer is stacked on the auxiliary light-emitting layer in the second color sub-pixel, the main light-emitting layer is stacked on the auxiliary light-emitting layer in the $N^{th}$ color sub-pixel. The main light-emitting layer of the first color sub-pixel and the auxiliary light-emitting layer of the second color sub-pixel are the same material layer, and the main light-emitting layer of the $N^{th}$ color sub-pixel and the auxiliary light-emitting layer of the first color sub-pixel are the same material layer.

The present invention provides a manufacturing method of a pixel array as follows. A substrate is provided, the substrate comprises a first region for forming a first color sub-pixel, a second region for forming a second color sub-pixel, and a third region for forming a third color sub-pixel. A first mask structure is provided, the first mask structure has a first opening pattern and a first shielding pattern. The first shielding pattern of the first mask structure corresponding to the third region and the first opening pattern corresponding to the first region and the second region. A first color light-emitting material deposition is performed so as to form a first color light-emitting layer respectively in the first region and the second region corresponding to the first opening pattern. A second mask structure is provided, and the second mask structure has a second opening pattern and a second shielding pattern. The second shielding pattern of the second mask structure corresponding to the first region and the second opening pattern corresponding to the second region and the third region. A second color light-emitting material deposition is performed so as to form a second color light-emitting layer respectively in the second region and the third region corresponding to the second opening pattern, wherein the second color light-emitting layer is stacked on the first color light-emitting layer in the second region so as to constitute a second stacked light-emitting layer of the second color sub-pixel. A third mask structure is provided, and the third mask structure has a third opening pattern and a third shielding pattern. The third shielding pattern of the third mask structure corresponding to the second region and the third opening pattern corresponding to the first region and the third region. A third color light-emitting material deposition is performed so as to form a third color light-emitting layer respectively in the first region and the third region corresponding to the third opening pattern, wherein the third color light-emitting layer is stacked on the first light-emitting layer in the first region so as to constitute a first stacked light-emitting layer of the first color sub-pixel, and the third color light-emitting layer is stacked on the second light-emitting layer in the third region so as to constitute a third stacked light-emitting layer of the third color sub-pixel.

The present invention further provides a pixel array comprising a plurality of pixel units. Each of the pixel units comprises N numbers of different color sub-pixels arranged adjacently, respectively being a first, a second till a $N^{th}$ color sub-pixel, wherein N is an integer and N≥3. A first color light-emitting layer is disposed in the first color sub-pixel and the second color sub-pixel. A second color light-emitting layer is disposed in the second color sub-pixel and the third color sub-pixel, wherein at the second color sub-pixel, the second color light-emitting layer is disposed on the first color light-emitting layer. A $N^{th}$ color light-emitting layer is disposed in the $N^{th}$ color sub-pixel and the first color sub-pixel, wherein at the $N^{th}$ color sub-pixel, the $N^{th}$ color light-emitting layer is disposed on a $N-1^{th}$ color light emitting layer, and at the first color sub-pixel, the $N^{th}$ color light-emitting layer is disposed on the first color light-emitting layer.

Based on the above, in the manufacturing method of a pixel array of the present invention, deposition is performed in a region where the opening pattern of the mask structure correspond to at least the sub-pixels of two different colors. Therefore, the sub-pixels of the pixel array manufactured by such method each comprises a stacked light-emitting layer having a main light-emitting layer and an auxiliary light-emitting layer. As such, the size of each pixel unit can be reduced, and a pixel array with higher pixel density and resolution can be manufactured.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
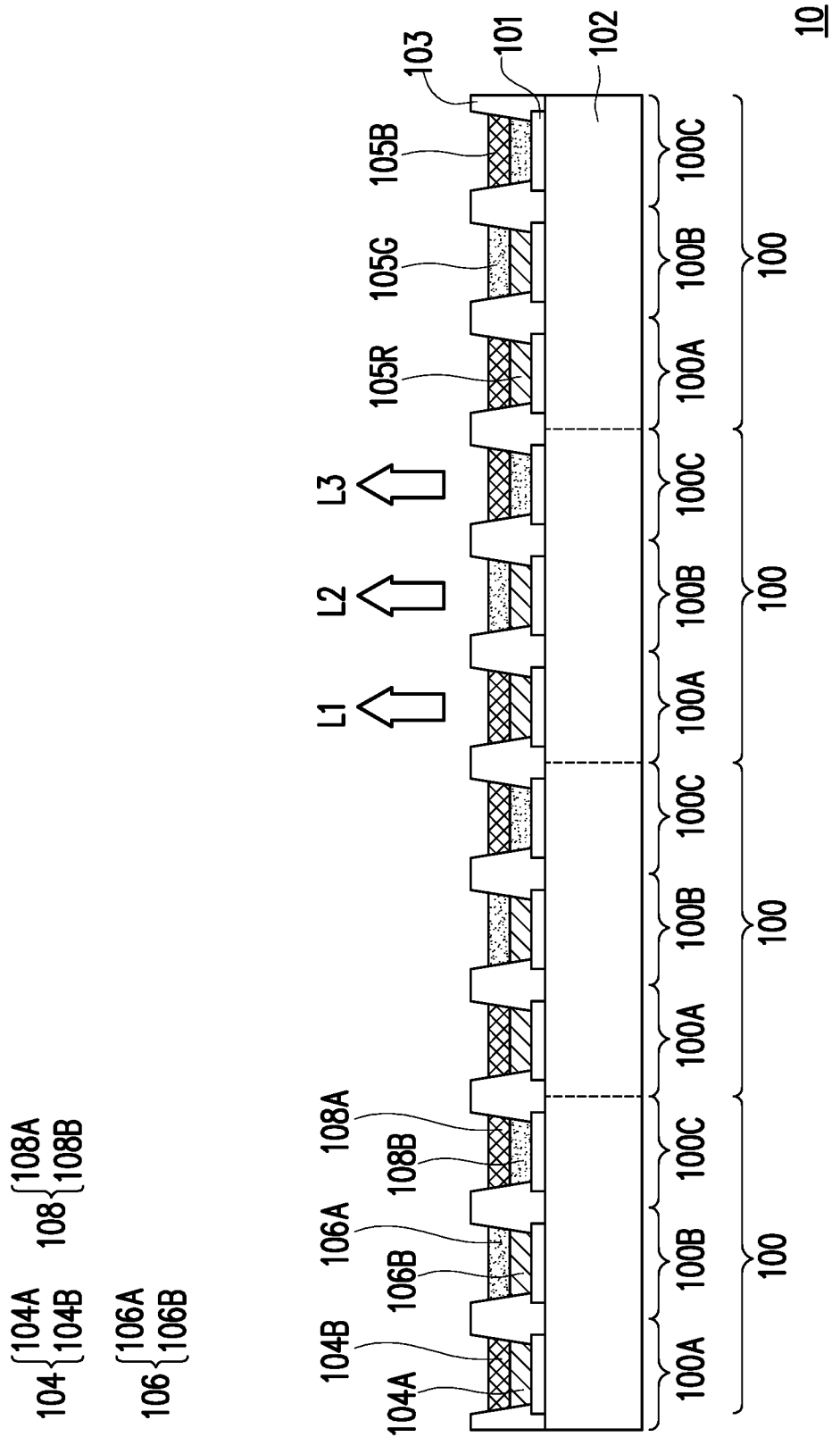
FIG. 1 is a cross-sectional view of a pixel array according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a cross-sectional view of a pixel array according to an embodiment of the invention. The pixel array 10 shown in FIG. 1 comprises a plurality of pixel units 100. Each pixel unit 100 is for example, formed on the substrate 102. A material of the substrate 102 can be glass, quartz, organic polymers, or opaque/reflective materials (e.g. conductive materials, metals, wafers, ceramics, or other suitable materials), or other suitable materials. If a conductive material or metal is used, then an insulating layer (not shown) is covered on the substrate 102 so as to avoid the problems of short circuit. Furthermore, a plurality of pixel electrodes 101 and banks 103 that are used to isolate each pixel electrode 101 are disposed on the substrate 102. The pixel electrode 101 for example, can be connected to a corresponding switch device (not shown).

In the embodiment of FIG. 1, each pixel unit 100 comprises a first color sub-pixel 100A, a second color sub-pixel 100B and a third color sub-pixel 100C. In particular, the first color sub-pixel 100A comprises a first stacked light-emitting layer 104, the second color sub-pixel 100B comprises a second stacked light-emitting layer 106, and the third color sub-pixel 100C comprises a third stacked light-emitting layer 108. In the present embodiments, the first stacked light-emitting layer 104, the second stacked light-emitting layer 106 and the third stacked light-emitting layer 108 each includes a main light-emitting layer (104A, 106A, 108A) and an auxiliary light-emitting layer (104B, 106B, 108B), wherein the main light-emitting layer (104A, 106A, 108A) and the auxiliary light-emitting layer (104B, 106B, 108B) are light emitting layers of different colors. In addition, the auxiliary light-emitting layer 104B is stacked on the main light-emitting layer 104A in the first color sub-pixel 100A, the main light-emitting layer 106A is stacked on the auxiliary light-emitting layer 106B in the second color sub-pixel 100B, and the main light-emitting layer 108A is stacked on the auxiliary light-emitting layer 108B in the third color sub-pixel 100C. Moreover, the main light-emitting layer 104A of the first color sub-pixel 100A and the auxiliary light-emitting layer 106B of the second color sub-pixel 100B are the same material layer (e.g. both are red light-emitting materials), the main light-emitting layer 106A of the second color sub-pixel 100B and the auxiliary light-emitting layer 108B of the third color sub-pixel 100C are the same material layer (e.g. both are green light-emitting materials), and the main light-emitting layer 108A of the third color sub-pixel 100C and the auxiliary light-emitting layer 104B of the first color sub-pixel 100A are the same material layer (e.g. both are blue light-emitting materials).

Referring to the embodiment of FIG. 1, each of the main light-emitting layers (104A, 106A, 108A) of the first stacked light-emitting layer 104, the second stacked light-emitting layer 106, and the third stacked light-emitting layer 108 emits light alone, and the auxiliary light-emitting layers (104B, 106B, 108B) do not emit light. More specifically, in the present embodiment, the first color sub-pixel 100A is a red subpixel, and the main light-emitting layer 104A of the first color sub-pixel 100A is a red light-emitting layer 105R, and the auxiliary light-emitting layer 104B is a blue light-emitting layer 105B (or light-emitting layer with another color), wherein the auxiliary light-emitting layer 104B does not emit light, therefore, the first color sub-pixel 100A will emit red light L1. The second color sub-pixel 100B is a green subpixel, and the main light-emitting layer 106A of the second color sub-pixel 100B is a green light-emitting layer 105G, and the auxiliary light-emitting layer 106B is a red light-emitting layer 105R (or light-emitting layer with another color), wherein the auxiliary light-emitting layer 106B does not emit light, therefore, the second color sub-pixel 100B will emit green light L2. The third color sub-pixel 100C is a blue subpixel, and the main light-emitting layer 108A of the third color sub-pixel 100C is a blue light-emitting layer 105B, and the auxiliary light-emitting layer 108B is a green light-emitting layer 105G (or light-emitting layer with another color), wherein the auxiliary light-emitting layer 108B does not emit light, therefore, the third color sub-pixel 100C will emit blue light L3.

In the embodiment of FIG. 1, since the first color sub-pixel 100A, the second color sub-pixel 100B and the third color sub-pixel 100C is composed of stacked light-emitting layers, therefore, it can overcome the process limitations and reduce the size of traditional sub-pixels, and to form pixel array having higher pixel density and resolution. Furthermore, although the present embodiment is explained in a way where the main light-emitting layer (104A, 106A, 108A) emits light alone, and the auxiliary light-emitting layer (104B, 106B, 108B) does not emit light, however, the present invention is not limited thereto. In another embodiment, each of the auxiliary light-emitting layers (104B, 106B, 108B) of the first stacked light-emitting layer 104, the second stacked light-emitting layer 106, and the third stacked light-emitting layer 108 emits light alone, and the main light-emitting layers (104A, 106A, 108A) does not emit light. In other words, as long as one of the light-emitting layers (main or auxiliary) needs to emit light, while the other one of the light-emitting layers (main or auxiliary) does not emit light. By doping different host materials and guest luminous materials that emit fluorescent or phosphorescence in the light-emitting layers, then one of the light-emitting layers in the stacked light-emitting layer (104, 106, 108) can emit light alone. The light-emitting mechanism of the light-emitting layers will be described in the latter paragraphs.

The manufacturing method of the pixel array 10 as shown in FIG. 1 will first be described in detail below.

Figure 2A:
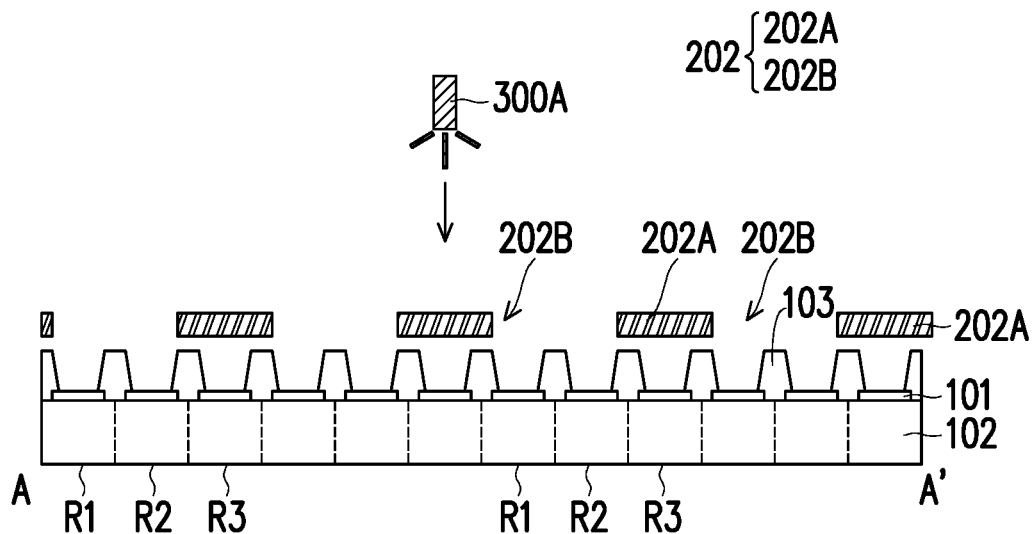
FIG. 2A to FIG. 2D are process flow of the steps of performing a first color light-emitting material deposition according to an embodiment of the invention.
Figure 2B:
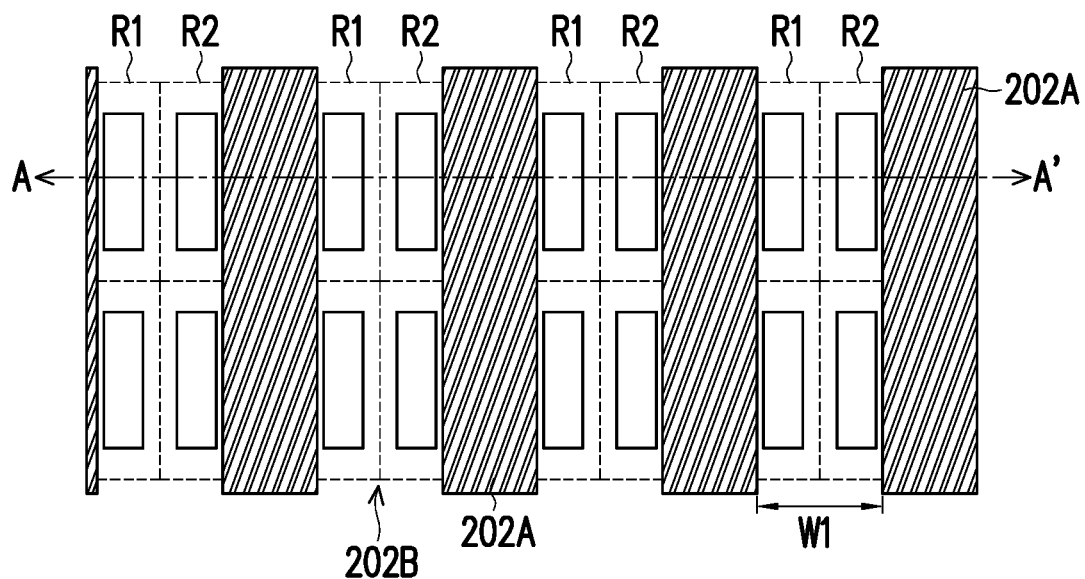

FIG. 2A to FIG. 2D are process flow of the steps of performing a first color light-emitting material deposition according to an embodiment of the invention. First of all, reference will be made to FIG. 2A and FIG. 2B for explanation. FIG. 2A is a cross-sectional view of a structure in one stage of a manufacturing method of the pixel array 10 according to an embodiment of the invention. FIG. 2B is a top view of a structure in one stage of a manufacturing method of the pixel array 10 according to an embodiment of the invention, and FIG. 2A is a cross-sectional view taken along line A-A' of FIG. 2B. As shown in FIG. 2A and FIG. 2B, a substrate 102 is first provided in the manufacturing method of a pixel array 10 of the present invention. A plurality of pixel electrodes 101 and banks 103 that are used to isolate each pixel electrodes 101 are disposed on the substrate 102. The pixel electrode 101 for example, can be connected to a corresponding switch device (not shown). The substrate 102 comprises a first region R1 that is expected to form a first color sub-pixel 100A, a second region R2 that is expected to form a second color sub-pixel 100B, and a third region R3 that is expected to form a third color sub-pixel 100C. As shown in FIG. 2A and FIG. 2B, a first mask structure 202 is provided, the first mask structure 202 has a first opening pattern 202B and a first shielding pattern 202A. In the present embodiment, the first shielding pattern 202A of the first mask structure 202 is disposed to correspond to the third region R3, and the first opening pattern 202B is disposed to correspond to the first region R1 and the second region R2. A first color light-emitting material deposition is performed at a position corresponding to the first opening pattern 202B by using a deposition source 300A.

Figure 2C:
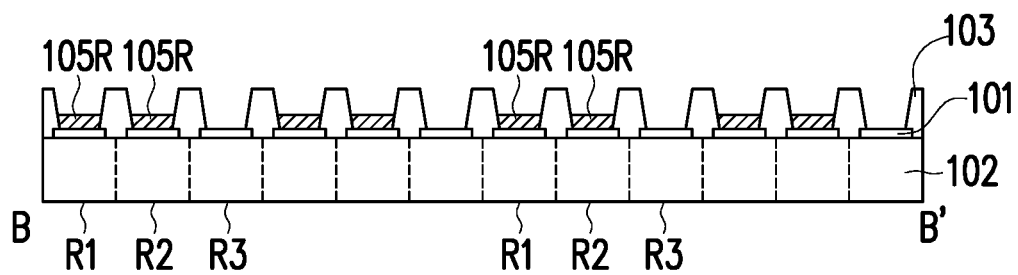
Figure 2D:
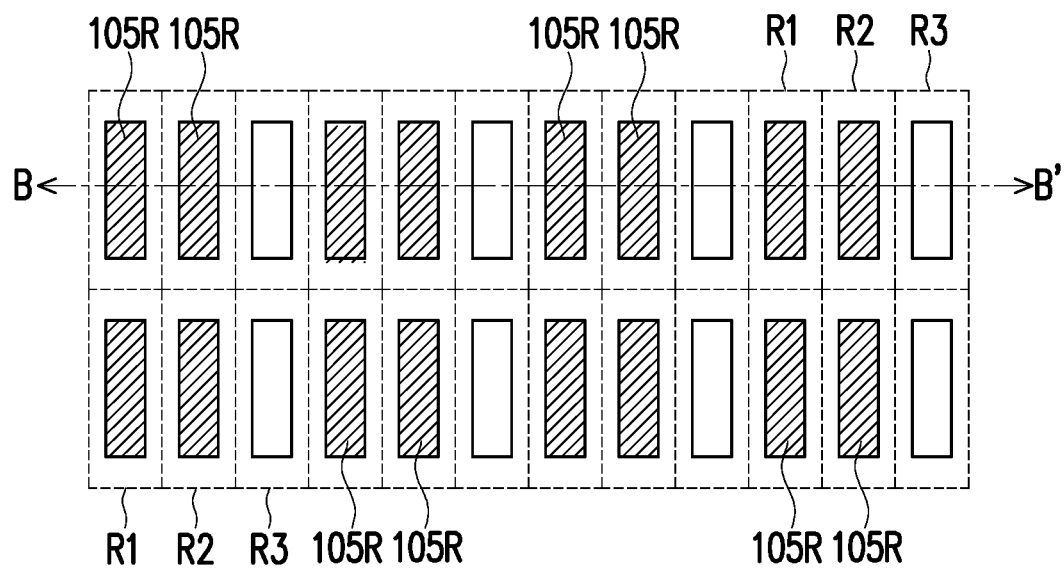

Next, reference will be made to FIG. 2C and FIG. 2D for explanation. FIG. 2C is a cross-sectional view of a structure in one stage of a manufacturing method of the pixel array 10 according to an embodiment of the invention. FIG. 2D is a top view of a structure in one stage of a manufacturing method of the pixel array 10 according to an embodiment of the invention, and FIG. 2C is a cross-sectional view taken along line B-B' of FIG. 2D. As shown in FIG. 2C and FIG. 2D, after performing the first color light-emitting material deposition, the first light-emitting layer 105R are formed in the first region R1 and the second region R2. Since the third region R3 is shielded by the first shielding pattern 202A of first mask structure 202, therefore, the first color light-emitting layer 105R will not be formed in the third region R3. In addition, in the present embodiment, the first color light-emitting layer 105R is for example, a red light-emitting layer, however, the present invention is not limited thereto. In other embodiments, it is possible to carry out the deposition process of other colored materials first so as to form light-emitting layers of other colors.

It should be noted in the present embodiment, that the deposition area of the first color material will generally be equal to the opening area of the first opening pattern 202B of the first mask structure 202. However, due to the presence of the banks 103 and the pixel electrode 101, the area of the first color light emitting layer 105R will not correspond to an entire area of the first opening pattern 202B, instead, it will correspond to only parts of the area of the first opening pattern 202B as shown in FIG. 2D. In the subsequent process, the same phenomenon occurs for the deposition area of other colored materials, hence its description will not be repeated thereafter. In addition, in the manufacturing method of a pixel array 10 of the present invention, the pixels are presented in a stripe arrangement, however, the present invention is not limited thereto. In other embodiments, the pixel may adopt other arrangements, such as mosaic arrangements and delta arrangements etc.

Figure 3A:
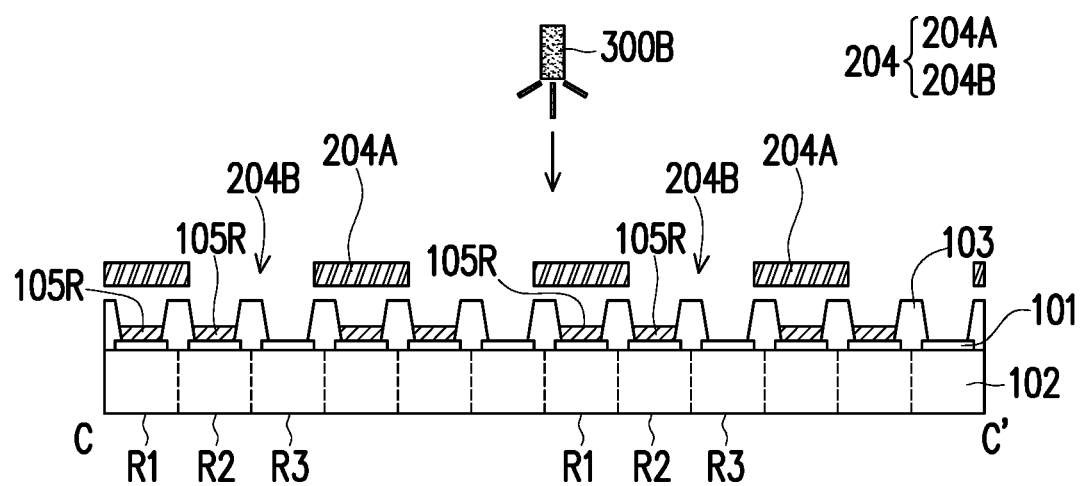
FIG. 3A to FIG. 3D are process flow of the steps of performing a second color light-emitting material deposition according to an embodiment of the invention.
Figure 3B:
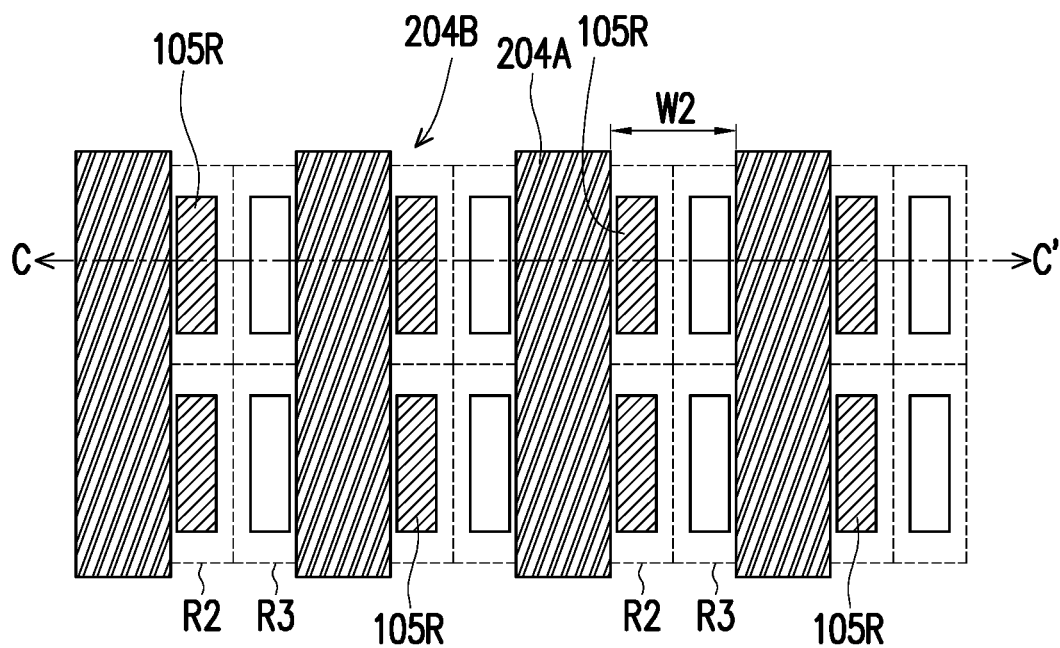

FIG. 3A to FIG. 3D are process flow of the steps of performing a second color light-emitting material deposition according to an embodiment of the invention. After performing the steps of the first color light-emitting material deposition as shown in FIG. 2A to FIG. 2D, the steps of the second color light-emitting material deposition is then performed. First of all, reference will be made to FIG. 3A and FIG. 3B for explanation. FIG. 3A is a cross-sectional view of a structure in one stage of a manufacturing method of the pixel array 10 according to an embodiment of the invention. FIG. 3B is a top view of a structure in one stage of a manufacturing method of the pixel array 10 according to an embodiment of the invention, and FIG. 3A is a cross-sectional view taken along line C-C' of FIG. 3B. As shown in FIG. 3A and FIG. 3B, a second mask structure 204 is provided, the second mask structure 204 has a second opening pattern 204B and a second shielding pattern 204A. In the present embodiment, the second shielding pattern 204A of the second mask structure 204 is disposed to correspond to the first region R1, and the second opening pattern 204B is disposed to correspond to the second region R2 and the third region R3. A second color light-emitting material deposition is performed at a position corresponding to the second opening pattern 204B by using a deposition source 300B.

Figure 3C:
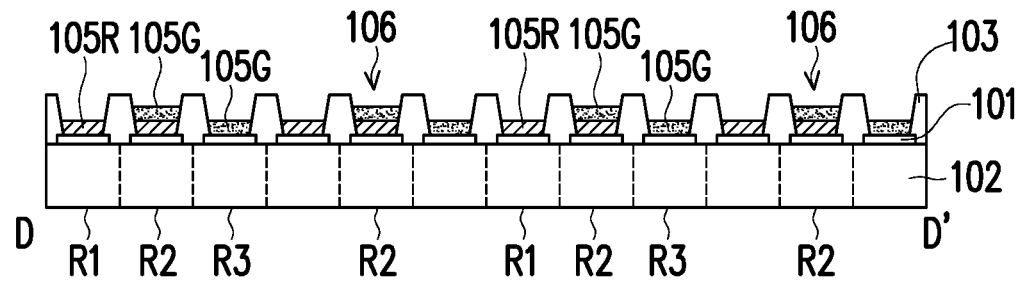
Figure 3D:
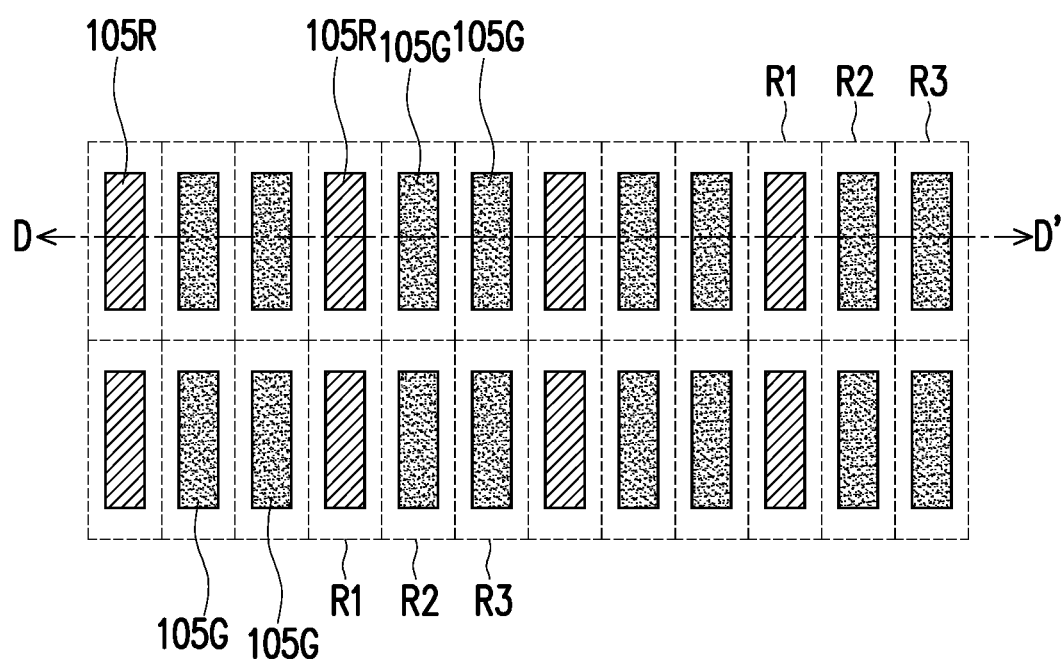

Next, reference will be made to FIG. 3C and FIG. 3D for explanation. FIG. 3C is a cross-sectional view of a structure in one stage of a manufacturing method of the pixel array 10 according to an embodiment of the invention. FIG. 3D is a top view of a structure in one stage of a manufacturing method of the pixel array 10 according to an embodiment of the invention, and FIG. 3C is a cross-sectional view taken along line D-D' of FIG. 3D. As shown in FIG. 3C and FIG. 3D, after performing the second color light-emitting material deposition, the second light-emitting layer 105G are formed in the second region R2 and the third region R3, wherein the second color light-emitting layer 105G is stacked on the first color light-emitting layer 105R in the second region R2 so as to constitute a second stacked light-emitting layer 106 of the second color sub-pixel 100B.

Since the first region R1 is shielded by the second shielding pattern 204A of the second mask structure 204, therefore, the second color light-emitting layer 105G will not be formed in the first region R1. In addition, in the present embodiment, the second color light-emitting layer 105G is for example, a green light-emitting layer, however, the present invention is not limited thereto. In other embodiments, it is possible to carry out the deposition process of other colored materials first so as to form light-emitting layers of other colors.

Figure 4A:
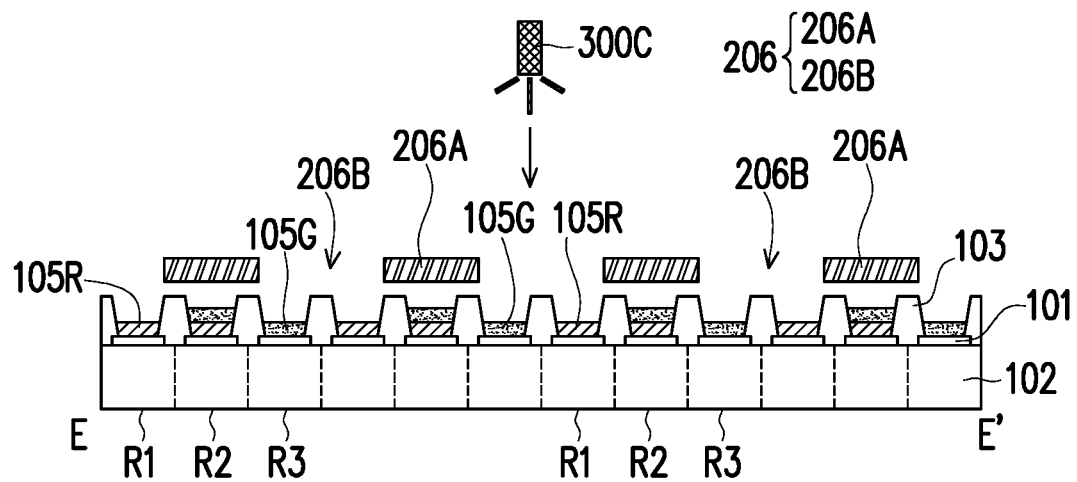
FIG. 4A to FIG. 4D are process flow of the steps of performing a third color light-emitting material deposition according to an embodiment of the invention.
Figure 4B:
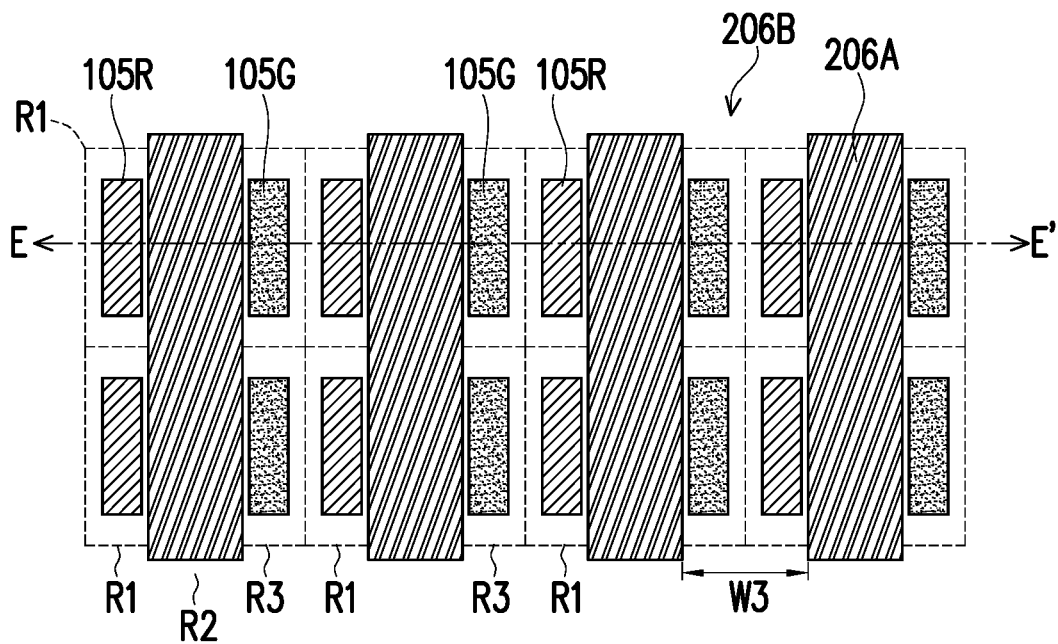

FIG. 4A to FIG. 4D are process flow of the steps of performing a third color light-emitting material deposition according to an embodiment of the invention. After performing the steps of the second color light-emitting material deposition as shown in FIG. 3A to FIG. 3D, the steps of the third color light-emitting material deposition is then performed. First of all, reference will be made to FIG. 4A and FIG. 4B for explanation. FIG. 4A is a cross-sectional view of a structure in one stage of a manufacturing method of the pixel array 10 according to an embodiment of the invention. FIG. 4B is a top view of a structure in one stage of a manufacturing method of the pixel array 10 according to an embodiment of the invention, and FIG. 4A is a cross-sectional view taken along line E-E' of FIG. 4B. As shown in FIG. 4A and FIG. 4B, a third mask structure 206 is provided, the third mask structure 206 has a third opening pattern 206B and a third shielding pattern 206A. In the present embodiment, the third shielding pattern 206A of the third mask structure 206 is disposed to correspond to the second region R2, and the third opening pattern 206B is disposed to correspond to the first region R1 and the third region R3. A third color light-emitting material deposition is performed at a position corresponding to the third opening pattern 206B by using a deposition source 300C.

Figure 4C:
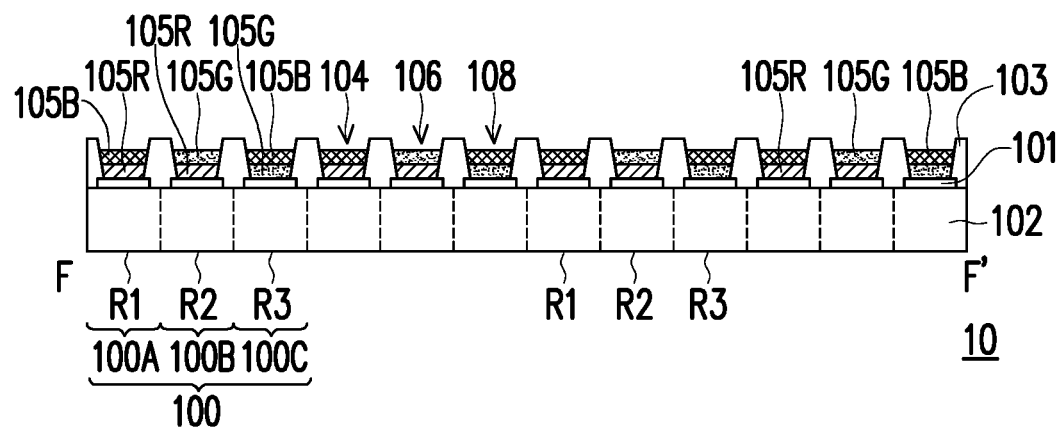
Figure 4D:
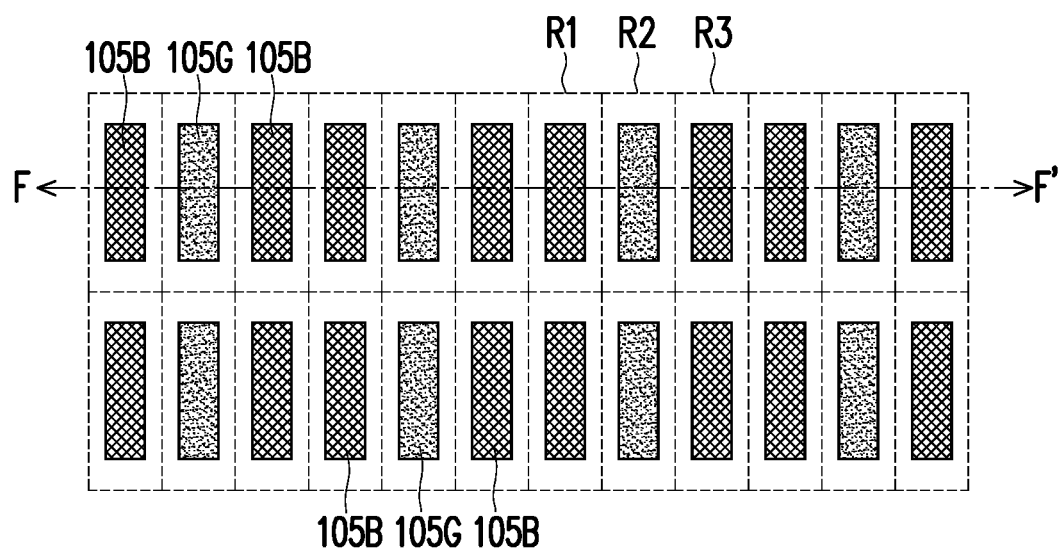

Next, reference will be made to FIG. 4C and FIG. 4D for explanation. FIG. 4C is a cross-sectional view of a structure in one stage of a manufacturing method of the pixel array 10 according to an embodiment of the invention. FIG. 4D is a top view of a structure in one stage of a manufacturing method of the pixel array 10 according to an embodiment of the invention, and FIG. 4C is a cross-sectional view taken along line F-F' of FIG. 4D. As shown in FIG. 4C and FIG. 4D, after performing the third color light-emitting material deposition, the third light-emitting layer 105B are formed in the first region R1 and the third region R3, wherein the third color light-emitting layer 105B is stacked on the first color light-emitting layer 105R in the first region R1 so as to constitute a first stacked light-emitting layer 104 of the first color sub-pixel 100A, and the third color light-emitting layer 105B is stacked on the second light-emitting layer 105G in the third region R3 so as to constitute a third stacked light-emitting layer 108 of the third color sub-pixel 100C. In addition, in the present embodiment, the third color light-emitting layer 105B is for example, a blue light-emitting layer, and it is the light-emitting layer that is formed last, however, the present invention is not limited thereto. In other embodiments, it is possible to form the blue light-emitting layer first, while the deposition process of other colored materials is performed last.

By performing the steps of the first color material deposition, the second color material deposition and the third color material deposition, the pixel array 10 shown in FIG. 1 can be formed. In the embodiments described above, a width dimension W1 of the first opening pattern 202B of the first mask structure 202, a width dimension W2 of the second opening pattern 204B of the second mask structure 204, and a width dimension W3 of the third opening pattern 206B of the third mask pattern 206 are respectively the same, however, the present invention is not limited thereto, and in other embodiments, the width dimensions can be adjusted based on the requirement of the pixel layout. In general, by using convention deposition methods, each opening of the mask will only correspond to one sub-pixel. However, in the present embodiment, when performing the deposition process, deposition is performed in a region whereby each of the opening patterns (202B, 204B, 206B) correspond to at least two sub-pixels of different color. In other words, when the size limit of existing fine metal masks (FMM) is 30 microns, if conventional mask designs and processing method is adopted, then the size of each sub-pixel will also be limited to about 30 microns. In comparison, by using the methods described in the embodiments of the present invention for forming the appropriate stacked light-emitting layers, then a size of each pixel unit may be effectively reduced. For example, in the present embodiment, the size limit of the sub-pixels may be changed to about 15 microns, so as to produce a pixel array with higher pixel density and resolution.

Furthermore, in the above-mentioned embodiments, the described examples are all directed to light-emitting layers formed with three different colors, but the present invention is not limited thereto. In other embodiments, pixel arrays formed by the stacking of light-emitting layers of four different colors or multiple colors may be achieved by using the methods described in FIG. 2A to FIG. 2D, FIG. 3A to FIG. 3D, and in FIG. 4A to FIG. 4D. Next, an example of forming light-emitting layers of four different colors will be described below.

Figure 5:
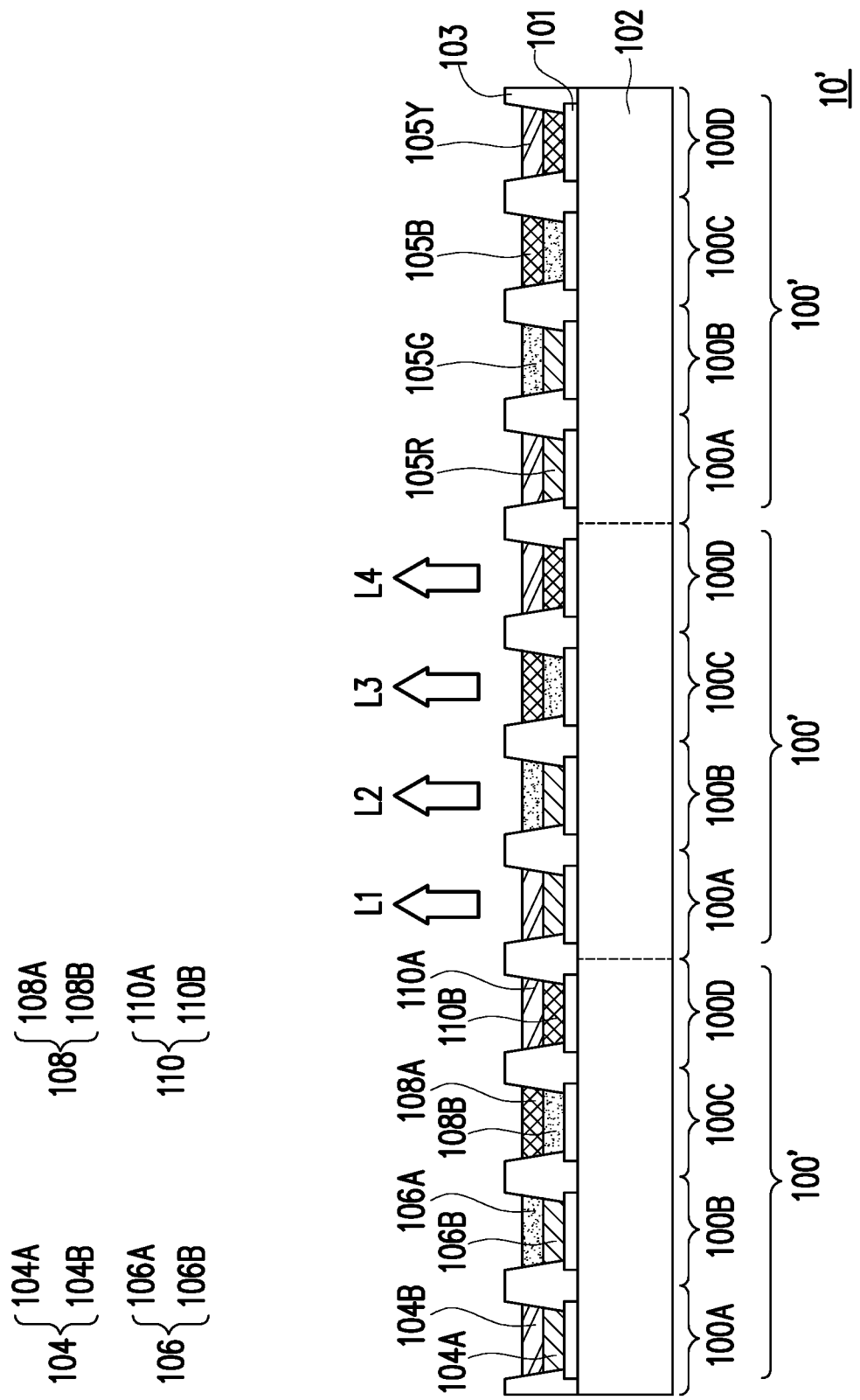
FIG. 5 is a cross-sectional view of a pixel array according to another embodiment of the invention.

FIG. 5 is a cross-sectional view of a pixel array according to another embodiment of the invention. The pixel array 10' of FIG. 5 is similar to the pixel array 10 of FIG. 1, hence the same reference numerals are used to refer to the same or like parts, and its detailed description will not be repeated herein. The difference between the embodiment of FIG. 5 and the embodiment of FIG. 1 is that the pixel array 10' of FIG. 5 further includes the formation of a fourth color sub-pixel 100D in the pixel unit 100'. The fourth color sub-pixel 100D comprises a fourth stacked light-emitting layer 110, and the fourth stacked light-emitting layer 110 includes a main light-emitting layer 110A and an auxiliary light-emitting layer 110B, wherein the main light-emitting layer 110A is stacked on the auxiliary light-emitting layer 110E in the fourth stacked light-emitting layer 110, and the main light-emitting layer 110A of the fourth color sub-pixel 100D and the auxiliary light-emitting layer 104B of the first color sub-pixel 100A are the same material layer. In the embodiment of FIG. 5, the main light-emitting layer 110A of the fourth stacked light-emitting layer 110 is for example, a yellow light-emitting layer 105Y, and the auxiliary light-emitting layer 110B is a blue light-emitting layer 105B (or light-emitting layer with another color), wherein the auxiliary light-emitting layer 110B does not emit light, therefore, the fourth color sub-pixel 100D will emit yellow light L4. However, the present invention is not limited thereto, according to the embodiments above, it is noted that the color or number of the light-emitting layers of the present invention is not particularly limited, as along as the expected light-emitting effect can be achieved.

For example, in one embodiment, the pixel array of the present invention may comprise a plurality of pixel units. Each pixel unit include N number of different color sub-pixels arranged adjacently, respectively being a first, a second till a $N^{th}$ color sub-pixel, wherein N is an integer and N≥3. In other words, each pixel unit includes at least three different color sub-pixels arranged adjacently, but the number of different color sub-pixels may be greater than 3, and the number can be 4 or 5, and so forth. In the embodiment of FIG. 1, N is 3, which means that there are three sub-pixels with different color, and in the embodiment of FIG. 5, N is 4, which means that there are four sub-pixels with different color. In addition, in the pixel array (10 or 10') of FIG. 1 and FIG. 5, the first color light-emitting layer 105R is disposed in the first color sub-pixel 100A and the second color sub-pixel 100B, the second color light-emitting layer 105G is disposed in the second color sub-pixel 100B and the third color sub-pixel 100C, wherein at the second color sub-pixel 100B, the second color light-emitting layer 105G is disposed on the first color light-emitting layer 105R. Furthermore, the $N^{th}$ color light-emitting layer (not shown) is disposed in the $N^{th}$ color sub-pixel (not shown) and the first color sub-pixel 100A, wherein at the $N^{th}$ color sub-pixel, the $N^{th}$ color light-emitting layer s disposed on a $N-1^{th}$ color light emitting layer (not shown), and at the first color sub-pixel 100A, the $N^{th}$ color light-emitting layer is disposed on the first color light-emitting layer 100A. Based on the above, it should be noted that when performing the deposition process of multiple color sub-pixels, the deposition is performed in a region where each of the corresponding opening patterns still corresponds to two sub-pixels of different color. In other words, by forming stacked light-emitting layers, it is possible to effectively reduce the size of each pixel unit to overcome the process restrictions, and form a pixel array with higher pixel density and resolution.

Figure 6:
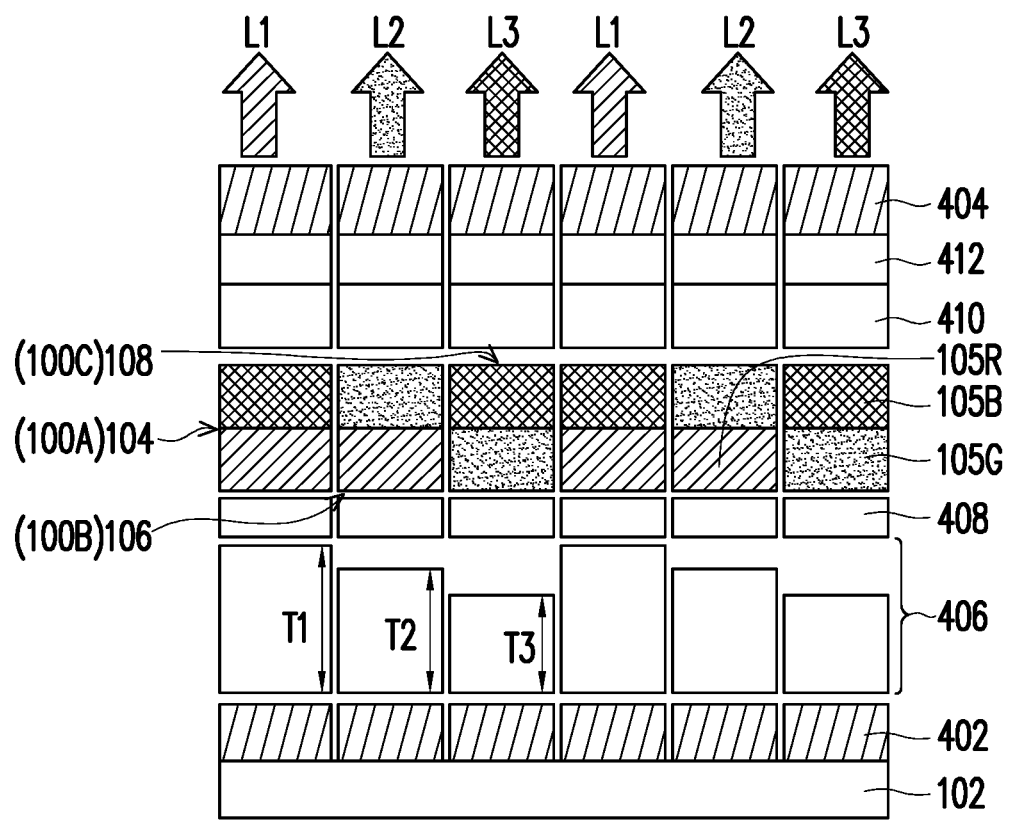
FIG. 6 is a schematic diagram of a light-emitting mechanism of a pixel array according to an embodiment of the invention.

FIG. 6 is a schematic diagram of a light-emitting mechanism of a pixel array according to an embodiment of the invention. Referring to the embodiment of FIG. 6, the pixel array 10 further comprises first electrode layer 402, second electrode layer 404, hole injection layer 406, hole transport layer 408, electron transport layer 410 and electron injection layer 412. As shown in FIG. 6, the first electrode layer 402 is formed on the substrate 102, which for example, comprises a plurality of pixel electrodes of each sub-pixels. The hole injection layer 406 is formed on the first electrode layer 402. The hole transport layer 408 is formed on the hole injection layer 406. The first stacked light-emitting layer 104 of the first color sub-pixel 100A, the second stacked light-emitting layer 106 of second color sub-pixel 100B and the third stacked light-emitting layer 108 of the third color sub-pixel 100C are respectively located on the hole transport layer 408. The electron transport layer 410 is formed on the first stacked light-emitting layer 104 of the first color sub-pixel 100A, the second stacked light-emitting layer 106 of the second color sub-pixel 100B and the third stacked light-emitting layer 108 of the third color sub-pixel 100C. The electron injection layer 412 is formed on the electron transport layer 410, and the second electrode layer 404 is formed on the electron injection layer 412.

More specifically, in the present embodiment, the hole injection layer 406 is located in between the first electrode 402 and the first stacked light-emitting layer 104, the second stacked light-emitting layer 106, or the third stacked light-emitting layer 108, wherein a thickness of the hole injection layer 406 may vary with the hole injection layer 406 is corresponding to the first color sub-pixel 100A, corresponding to the second color sub-pixel 100B or corresponding to the third color sub-pixel 100C. In particular, in the present embodiment, the first color sub-pixel 100A is a red sub-pixel, and the hole injection layer 406 corresponding to the red sub-pixel has a first thickness T1, the second color sub-pixel 100B is a green sub-pixel, and the hole injection layer 406 corresponding to the green sub-pixel has a second thickness T2, the third color sub-pixel 100C is a blue sub-pixel, and the hole injection layer corresponding to the blue sub-pixel has a third thickness T3, wherein the first thickness T1 is greater than the second thickness T2, and the second thickness T2 is greater the third thickness T3, but the present invention is not limited thereto. In the embodiment of FIG. 6, by doping different host materials and guest luminous materials that emit fluorescent or phosphorescence in each of the light-emitting layer (such as in the red light-emitting layer 105R, the green light-emitting layer 105G or the blue light-emitting layer 105B), then one of the light-emitting layers in the stacked light-emitting layer (104, 106, 108) can emit light alone. However, the present invention is not limited thereto, and in other embodiments, the same objective may be achieved by adjusting the thickness of the first electrode layer 402 or hole transport layer 408 in different color sub-pixels. Next, the light-emitting mechanism of each color sub-pixel will be described.

Figure 7A:
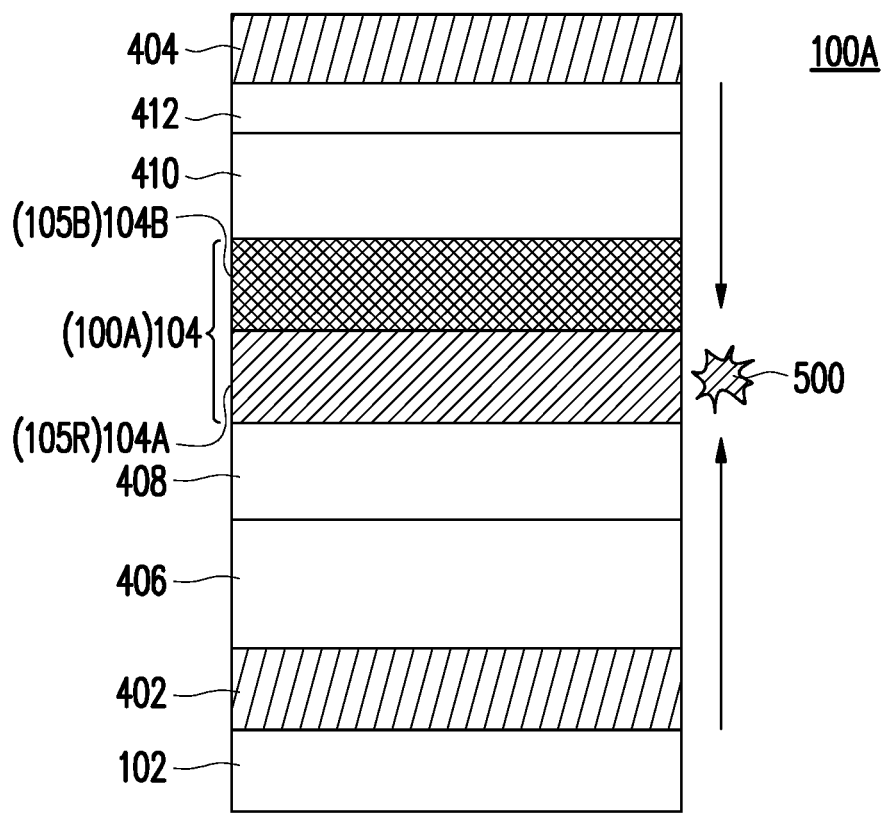
FIG. 7A is a schematic diagram of a light-emitting mechanism of a red sub-pixel according to an embodiment of the invention.
Figure 7B:
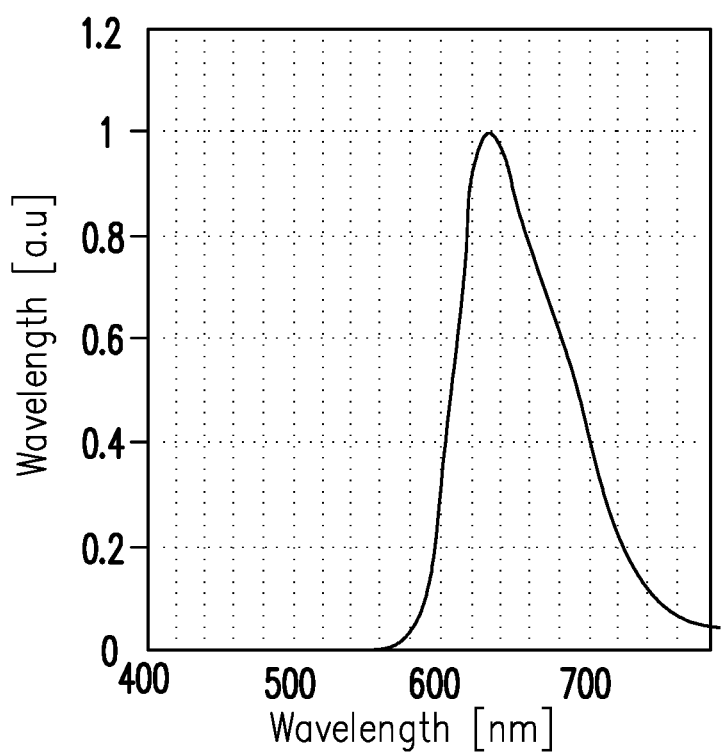
FIG. 7B is a spectrum diagram of a red sub pixel according to an embodiment of the invention.

FIG. 7A is a schematic diagram of a light-emitting mechanism of a red sub-pixel according to an embodiment of the invention. FIG. 7B is a spectrum diagram of a red sub-pixel according to an embodiment of the invention. In FIG. 7A and FIG. 7B, the same reference numerals are used to refer to same or like parts as the embodiments above, hence its description is omitted, or its description may be referred to the explanation provided in the embodiment of FIG. 6. In the embodiment of FIG. 7A and FIG. 7B, the first color sub-pixel 100A is, for example, a red sub-pixel, and the main light-emitting layer 104A is located below the auxiliary light-emitting layer 104B in the first stacked light-emitting layer 104. The main light-emitting layer 104A is, for example, a red light-emitting layer 105R, which includes specific host materials and guest luminous materials that emit red fluorescent or phosphorescence. The auxiliary light-emitting layer 104B is, for example, a blue light-emitting layer 105B, which includes specific host materials and guest luminous materials that emit blue fluorescent or phosphorescence. In the present embodiment, an electron transport speed of the host material of the blue light-emitting layer 105B is faster than a hole transport speed of the host material of the red light-emitting layer 105R. As such, a recombination region 500 of the electrons and the holes will be located at the red light-emitting layer 105R so that the red light-emitting layer 105R emits red light, and the blue light-emitting layer 105B does not emit light.

By referring to the spectrum diagram shown in FIG. 7B, it can be known that only one particular wavelength having stronger intensity is present, wherein the wave front is located in between 620 nm to 680 nm. In other words, only red light with high light purity is observed from the spectrum, and such red light is completely different to the red light achieved by using mixed light designs. Furthermore, the host materials used in the red light-emitting layer 105R or the blue light-emitting layer 105B is not particularly limited, as long as the transport speed of the electrons/holes satisfies the requirement whereby the recombination region 500 is located at the red light-emitting layer 105R. Since the pixel array of the present invention can control the recombination region 500 to be located at a single light-emitting layer, therefore, the stacked light-emitting layers will have one of the layers that emit light, while the other one of the layers does not emit light. As such, lights with high color purity can be achieved, and will benefit the production of a pixel array with higher pixel density and resolution.

Figure 8A:
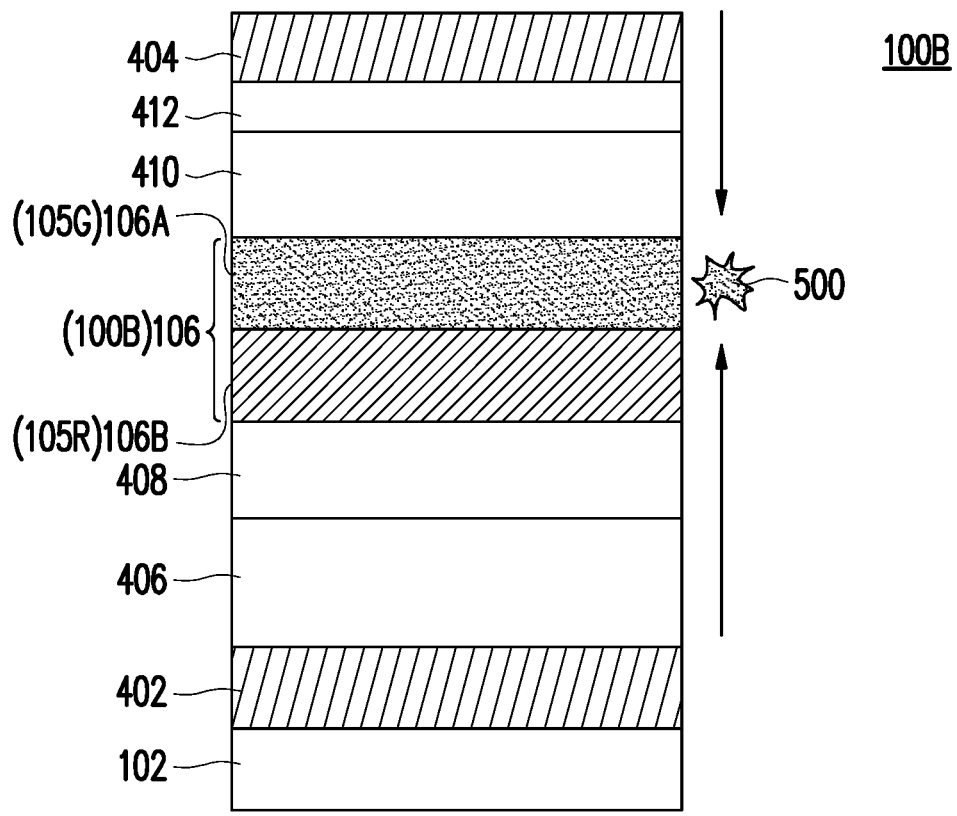
FIG. 8A is a schematic diagram of a light-emitting mechanism of a green sub-pixel according to an embodiment of the invention.
Figure 8B:
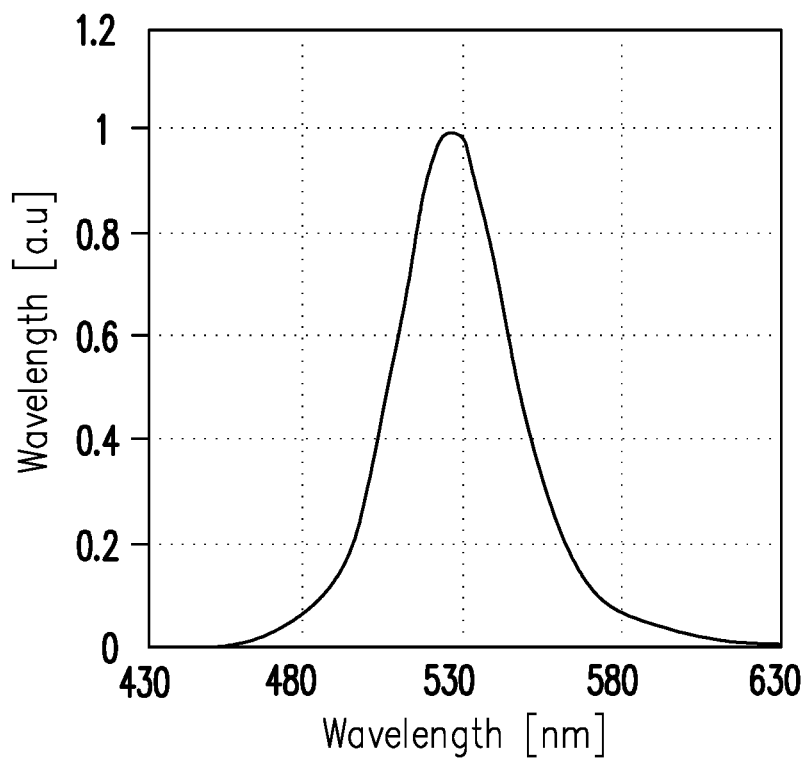
FIG. 8B is a spectrum diagram of a green sub pixel according to an embodiment of the invention.

FIG. 8A is a schematic diagram of a light-emitting mechanism of a green sub-pixel according to an embodiment of the invention. FIG. 8B is a spectrum diagram of a green sub pixel according to an embodiment of the invention. In FIG. 8A and FIG. 8B, the same reference numerals are used to refer to same or like parts as the embodiments above, hence its description is omitted, or its description may be referred to the explanation provided in the embodiment of FIG. 6. In the embodiment of FIG. 8A and FIG. 8B, the second color sub-pixel 100B is, for example, a green sub-pixel, and the main light-emitting layer 106A is located above the auxiliary light-emitting layer 106B in the second stacked light-emitting layer 106. The main light-emitting layer 106A is, for example, a green light-emitting layer 105G, which includes specific host materials and guest luminous materials that emit green fluorescent or phosphorescence. The auxiliary light-emitting layer 106B is, for example, a red light-emitting layer 105R, which includes specific host materials and guest luminous materials that emit red fluorescent or phosphorescence. In the present embodiment, a hole transport speed of the host material of the red light-emitting layer 105R is faster than an electron transport speed of the host material of the green light-emitting layer 105G. As such, a recombination region 500 of the electrons and the holes will be located at the green light-emitting layer 105G so that the green light-emitting layer 105G emits green light, and the red light-emitting layer 105R does not emit light.

By referring to the spectrum diagram shown in FIG. 8B, it can be known that only one particular wavelength having stronger intensity is present, wherein the wave front is located in between 500 nm to 570 nm. In other words, only green light with high light purity is observed from the spectrum, and such green light is completely different to the green light achieved by using mixed light designs. Furthermore, the host materials used in the green light-emitting layer 105G or the red light-emitting layer 105R is not particularly limited, as long as the transport speed of the electrons/holes satisfies the requirement whereby the recombination region 500 is located at the green light-emitting layer 105G. Since the pixel array of the present invention can control the recombination region 500 to be located at a single light-emitting layer, therefore, the stacked light-emitting layers will have one of the layers that emit light, while the other one of the layers does not emit light. As such, lights with high color purity can be achieved, and will benefit the production of a pixel array with higher pixel density and resolution.

Figure 9A:
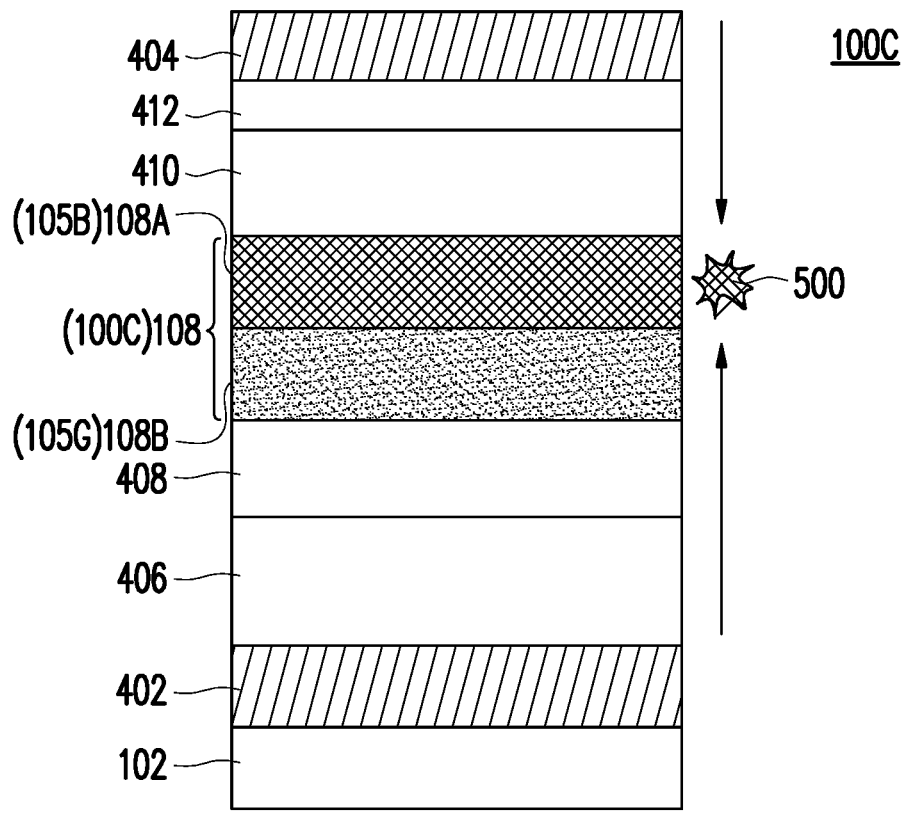
FIG. 9A is a schematic diagram of a light-emitting mechanism of a blue sub-pixel according to an embodiment of the invention.
Figure 9B:
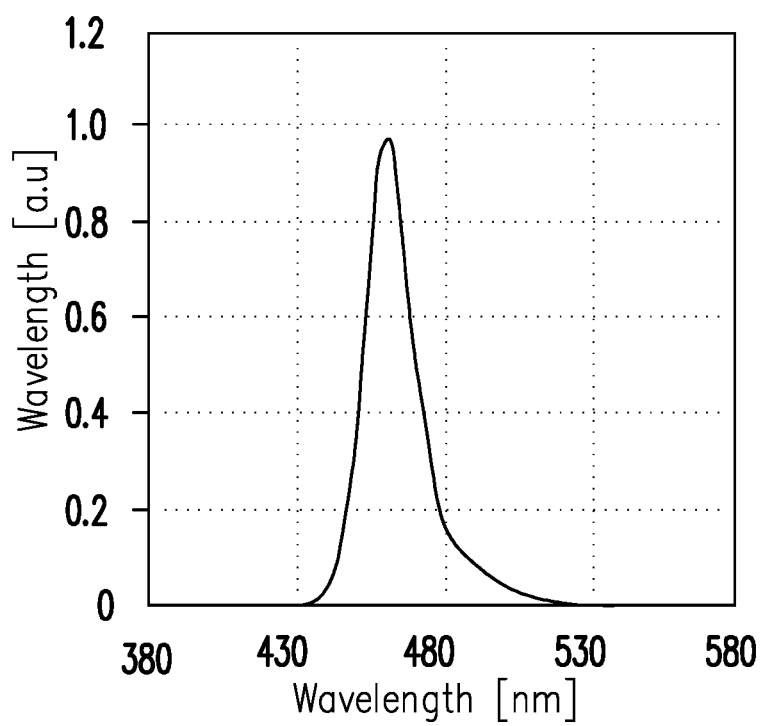
FIG. 9B is a spectrum diagram of a blue sub pixel according to an embodiment of the invention.

FIG. 9A is a schematic diagram of a light-emitting mechanism of a blue sub-pixel according to an embodiment of the invention. FIG. 9B is a spectrum diagram of a blue sub pixel according to an embodiment of the invention. In FIG. 9A and FIG. 9B, the same reference numerals are used to refer to same or like parts as the embodiments above, hence its description is omitted, or its description may be referred to the explanation provided in the embodiment of FIG. 6. In the embodiment of FIG. 9A and FIG. 9B, the third color sub-pixel 100C is, for example, a blue sub-pixel, and the main light-emitting layer 108A is located above the auxiliary light-emitting layer 108B in the third stacked light-emitting layer 108. The main light-emitting layer 108A is, for example, a blue light-emitting layer 105B, which includes specific host materials and guest luminous materials that emit blue fluorescent or phosphorescence. The auxiliary light-emitting layer 108B is, for example, a green light-emitting layer 105G, which includes specific host materials and guest luminous materials that emit green fluorescent or phosphorescence. In the present embodiment, a hole transport speed of the host material of the green light-emitting layer 105G is faster than an electron transport speed of the host material of the blue light-emitting layer 105B. As such, a recombination region 500 of the electrons and the holes will be located at the blue light-emitting layer 105B so that the blue light-emitting layer 105B emits blue light, and the green light-emitting layer 105G does not emit light.

By referring to the spectrum diagram shown in FIG. 9B, it can be known that only one particular wavelength having stronger intensity is present, wherein the wave front is located in between 430 nm to 480 nm. In other words, only blue light with high light purity is observed from the spectrum, and such blue light is completely different to the blue light achieved by using mixed light designs. Furthermore, the host materials used in the green light-emitting layer 105G or the blue light-emitting layer 105B is not particularly limited, as long as the transport speed of the electrons/holes satisfies the requirement whereby the recombination region 500 is located at the blue light-emitting layer 105B. Since the pixel array of the present invention can control the recombination region 500 to be located at a single light-emitting layer, therefore, the stacked light-emitting layers will have one of the layers that emit light, while the other one of the layers does not emit light. As such, lights with high color purity can be achieved, and will benefit the production of a pixel array with higher pixel density and resolution.

Accordingly, in the manufacturing method of a pixel array of the present invention, deposition is performed in a region where the opening pattern of the mask structure corresponds to at least the sub-pixels of two different colors. Therefore, the sub-pixels of the pixel array manufactured by such method each comprise a stacked light-emitting layer having a main light-emitting layer and an auxiliary light-emitting layer. Furthermore, the size of each sub-pixel is not limited by the process restrictions of the fine metal mask, hence, the size of the pixel units can be made smaller, and a manufacturing cost can be reduced, thus the pixel density and resolution of the formed pixel array may be significantly improved. In addition, in the stacked light-emitting layers, one of the layers emits light while the other one of the layers does not emit light. As such, lights with high color purity can be achieved, and will benefit the production of a pixel array with higher pixel density and resolution.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel may, comprising:
   a plurality of pixel units, wherein each of the pixel units comprise at least a first color sub-pixel, a second color sub-pixel and a $N^{th}$ color sub-pixel, wherein N is an integer and N≥3, the first color sub-pixel comprise a first stacked light-emitting layer, the second color sub-pixel comprise a second stacked light-emitting layer, and the $N^{th}$ color sub-pixel comprises a $N^{th}$ stacked light-emitting layer, each of the first stacked light-emitting layer, the second stacked light-emitting layer, and the $N^{th}$ stacked light emitting layer comprises:
   a main light-emitting layer and an auxiliary light-emitting layer, directly contacted with each other, wherein the main light-emitting layer and the auxiliary light-emitting layer are light emitting layers of different color,
   wherein the auxiliary light-emitting layer is stacked on the main light-emitting layer in the first color sub-pixel, the main light-emitting layer is stacked on the auxiliary light-emitting layer in the second color sub-pixel, the main light-emitting layer is stacked on the auxiliary light-emitting layer in the $N^{th}$ color sub-pixel, the main light-emitting layer of the first color sub-pixel and the auxiliary light-emitting layer of the second color sub-pixel are the same material layer, the main light-emitting layer of the $N^{th}$ color sub-pixel and the auxiliary light-emitting layer of the first color sub-pixel are the same material layer, and a bank divides the main light-emitting layer of the first color sub-pixel, the main light-emitting layer of the second color sub-pixel and the main light-emitting layer of the $N^{th}$ color sub-pixel, wherein each of the main light-emitting layers of the first stacked light-emitting layer, the second stacked light-emitting layer and the $N^{th}$ stacked light-emitting layer emits light alone, and the auxiliary light-emitting layers do not emit light, or wherein each of the auxiliary light-emitting layers of the first stacked light-emitting layer, the second stacked light-emitting layer and the $N^{th}$ stacked light-emitting layer emits light alone, and the main light-emitting layers do not emit light.

2. The pixel array according to claim 1, wherein N=3, the $N^{th}$ color sub-pixel is a third color sub-pixel, the first color sub-pixel is a red sub-pixel, and the main light-emitting layer of the first color sub-pixel is a red light-emitting layer so that the first color sub-pixel emits red light, the second color sub-pixel is a green sub-pixel, and the main light-emitting layer of the second color sub-pixel is a green light-emitting layer so that the second color sub-pixel emits green light, the third color sub-pixel is a blue sub-pixel, and the main light-emitting layer of the third color sub-pixel is a blue light-emitting layer so that the third color sub-pixel emits blue light.

3. The pixel array according to claim 1, wherein N=3, the $N^{th}$ color sub-pixel is a third color sub-pixel, and each of the pixel unit further comprises:
   a first electrode layer;
   a second electrode layer, wherein the first stacked light-emitting layer of the first color sub-pixel, the second stacked light-emitting layer of the second color sub-pixel and a third stacked light-emitting layer of the third color sub-pixel are respectively located in between the first electrode layer and the second electrode layer; and
   a hole injection layer, located in between the first electrode layer and the first stacked light-emitting layer, the second stacked light-emitting layer, or the third stacked light-emitting layer, wherein a thickness of the hole injection layer varies with the hole injection layer is corresponding to the first color sub-pixel, the second color sub-pixel or the third color sub-pixel.

4. The pixel array according to claim 3, wherein the first color sub-pixel is a red sub-pixel, and the hole injection layer corresponding to the red sub-pixel has a first thickness, the second color sub-pixel is a green sub-pixel, and the hole injection layer corresponding to the green sub-pixel has a second thickness, the third color sub-pixel is a blue sub-pixel, and the hole injection layer corresponding to the blue sub-pixel has a third thickness, wherein the first thickness is greater than the second thickness, and the second thickness is greater the third thickness.

5. The pixel array according to claim 1, wherein when N=4, each of the pixel units further comprises a third color sub-pixel, and the $N^{th}$ color sub-pixel is a fourth color sub-pixel, the main light-emitting layer of the third color sub-pixel and the auxiliary layer of the fourth color sub-pixel are the same material layer, and the main light-emitting layer of the fourth color sub-pixel and the auxiliary light-emitting layer of the first color sub-pixel are the same material layer.

6. A pixel array, comprising:
   a plurality of pixel units, wherein each of the pixel units comprises N numbers of different color sub-pixels arranged adjacently, respectively being a first, a second till a $N^{th}$ color sub-pixel, wherein N is an integer and N≥3;
   a first color light-emitting layer disposed in the first color sub-pixel and the second color sub-pixel;
   a second color light-emitting layer disposed in the second color sub-pixel and the third color sub-pixel, wherein at the second color sub-pixel, the second color light-emitting layer is disposed on and directly contacted with the first color light-emitting layer; and
   a $N^{th}$ color light-emitting layer disposed in the $N^{th}$ color sub-pixel and the first color sub-pixel, wherein at the $N^{th}$ color sub-pixel, the $N^{th}$ color light-emitting layer is disposed on and directly contacted with a $N-1^{th}$ color light emitting layer, and at the first color sub-pixel, the $N^{th}$ color light-emitting layer is disposed on and directly contacted with the first color light-emitting layer.

7. The pixel array according to claim 6, wherein at the first color sub-pixel, the first color light-emitting layer emits light alone and the $N^{th}$ color light-emitting layer does not emit light, at the second color sub-pixel, the second color light-emitting layer emits light alone and the first light-emitting layer does not emit light, and at the $N^{th}$ color sub-pixel, the $N^{th}$ color light-emitting layer emits light alone and the $N-1^{th}$ color light-emitting layer does not emit light.

8. The pixel array according to claim 6, wherein the first color sub-pixel is a red sub-pixel, and the first color sub-pixel emits red light through the first color light-emitting layer, and the second color sub-pixel is a green sub-pixel, and the second color sub-pixel emits green light through the second color light-emitting layer, and the $N^{th}$ color sub-pixel is a blue sub-pixel, and the $N^{th}$ color sub-pixel emits blue light through the $N^{th}$ color light-emitting layer.

9. The pixel array according to claim 6, wherein the first color sub-pixel is a red sub-pixel, and the first color sub-pixel emits red light through the first color light-emitting layer, and the second color sub-pixel is a green sub-pixel, and the second color sub-pixel emits green light through the second color light-emitting layer, and the $N^{th}$ color sub-pixel is a yellow sub-pixel, and the $N^{th}$ color sub-pixel emits yellow light through the $N^{th}$ color light-emitting layer.

10. The pixel array according to claim 6, wherein each of the pixel units further comprises:
    a first electrode layer;
    a second electrode layer, wherein the first color light-emitting layer of the first color sub-pixel, the second color light-emitting layer of the second color sub-pixel and the $N^{th}$ color light-emitting layer of the $N^{th}$ color sub-pixel, are respectively located in between the first electrode layer and the second electrode layer; and
    a hole injection layer, located in between the first electrode layer and the first color light-emitting layer, the second color light-emitting layer, or the $N^{th}$ color light-emitting layer, wherein a thickness of the hole injection layer varies with the hole injection layer is corresponding to the first color sub-pixel, the second color sub-pixel or the $N^{th}$ color sub-pixel.

11. The pixel array according to claim 10, wherein the first color sub-pixel is a red sub-pixel, and the hole injection layer corresponding to the red sub-pixel has a first thickness, the second color sub-pixel is a green sub-pixel, and the hole injection layer corresponding to the green sub-pixel has a second thickness, the $N^{th}$ color sub-pixel is a blue sub-pixel, and the hole injection layer corresponding to the blue sub-pixel has a third thickness, wherein the first thickness is greater than the second thickness, and the second thickness is greater the third thickness.

12. The pixel array according to claim 6, wherein the $N^{th}$ color light-emitting layer is a fourth color light-emitting layer, and the $N-1^{th}$ color light-emitting layer is a third color light-emitting layer, and the third color light-emitting layer is disposed in the third color sub-pixel and the fourth color sub-pixel, and at the third color sub-pixel, the third color light-emitting layer is disposed on the second color light-emitting layer.

* * * * *